(12) United States Patent
Shinoda et al.

(10) Patent No.: US 9,398,709 B2
(45) Date of Patent: Jul. 19, 2016

(54) PORTABLE ELECTRONIC APPARATUS

(71) Applicant: FUJITSU LIMITED, Kawasaki-shi, Kanagawa (JP)

(72) Inventors: Takao Shinoda, Yokohama (JP); Kohei Choraku, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 360 days.

(21) Appl. No.: 14/165,201

(22) Filed: Jan. 27, 2014

(65) Prior Publication Data

US 2014/0140033 A1    May 22, 2014

Related U.S. Application Data

(63) Continuation of application No. PCT/JP2011/067904, filed on Aug. 4, 2011.

(51) Int. Cl.
*H05K 7/02* (2006.01)
*H05K 5/06* (2006.01)
(Continued)

(52) U.S. Cl.
CPC .............. *H05K 5/061* (2013.01); *G06F 1/1656* (2013.01); *H04M 1/0262* (2013.01); *H04M 1/18* (2013.01)

(58) Field of Classification Search
CPC ...................................... H05K 3/301
USPC ......................................... 361/809
See application file for complete search history.

(56) References Cited

U.S. PATENT DOCUMENTS 5,532,431 A * 7/1996 Saka ........................ B29C 39/24
174/521
2010/0206601 A1 * 8/2010 Choraku ................ H05K 5/061
174/50.5

2010/0265656 A1 * 10/2010 Yamaguchi ........... G06F 1/1616
361/679.55

FOREIGN PATENT DOCUMENTS

JP    7-37342 Y2    11/1991
JP    7-39043 A    2/1995
(Continued)

OTHER PUBLICATIONS

Notification of Transmittal of Translation of the International Preliminary Report on Patentabililty (Form PCT/IB/338) of International Application No. PCT/JP2011/067904 mailed Feb. 13, 2014 with Forms PCT/IB/373 and PCT/ISA/237, w/ English translation (13 pages).

(Continued)

*Primary Examiner* — Forrest M Phillips
(74) *Attorney, Agent, or Firm* — Westerman, Hattori, Daniels & Adrian, LLP

(57) ABSTRACT

A portable electronic apparatus has a water-resistant structure in which a cover covers a surface of an opening formed in a casing of the portable electronic apparatus. The portable electronic apparatus includes a mounting unit that has an outer peripheral surface to which frame-shaped packing that encompasses the opening is attached, and is formed on any one among the casing and the cover; and a groove that is formed on an outer peripheral surface of the mounting unit, and holds the frame-shaped packing therein enabling a surface of the frame-shaped packing to be brought into pressure contact with any one among the casing and the cover to which the mounting is not formed. The mounting unit has a side and a corner, and is of a shape that encompasses the opening, and the groove has a shape at the corner different from that along the side.

5 Claims, 6 Drawing Sheets

(51) Int. Cl.
*H04M 1/02* (2006.01)
*G06F 1/16* (2006.01)
*H04M 1/18* (2006.01)

(56) References Cited

FOREIGN PATENT DOCUMENTS

| JP | 2001-91996 A | 4/2001 |
|---|---|---|
| JP | 2009-045105 A | 3/2009 |
| JP | 2010-192997 A | 9/2010 |
| JP | 2010-251616 A | 11/2010 |

OTHER PUBLICATIONS

Japanese Office Action dated Jan. 27, 2015, issued in corresponding JP Patent Application No. 2013-526706 with English partial translation (4 pages).

International Search Report dated Aug. 30, 2011 issued in corresponding application No. PCT/JP2011/067904.

* cited by examiner

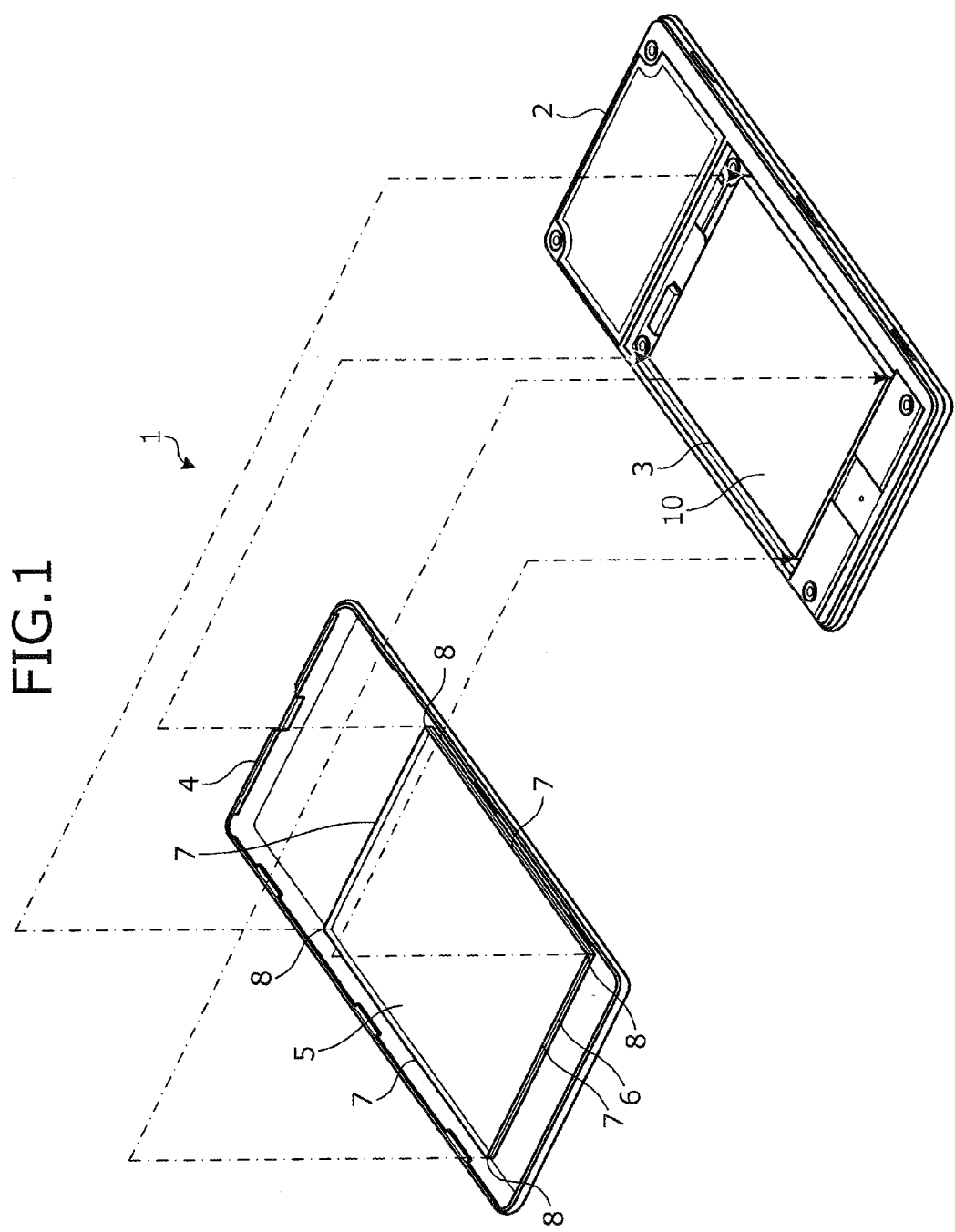

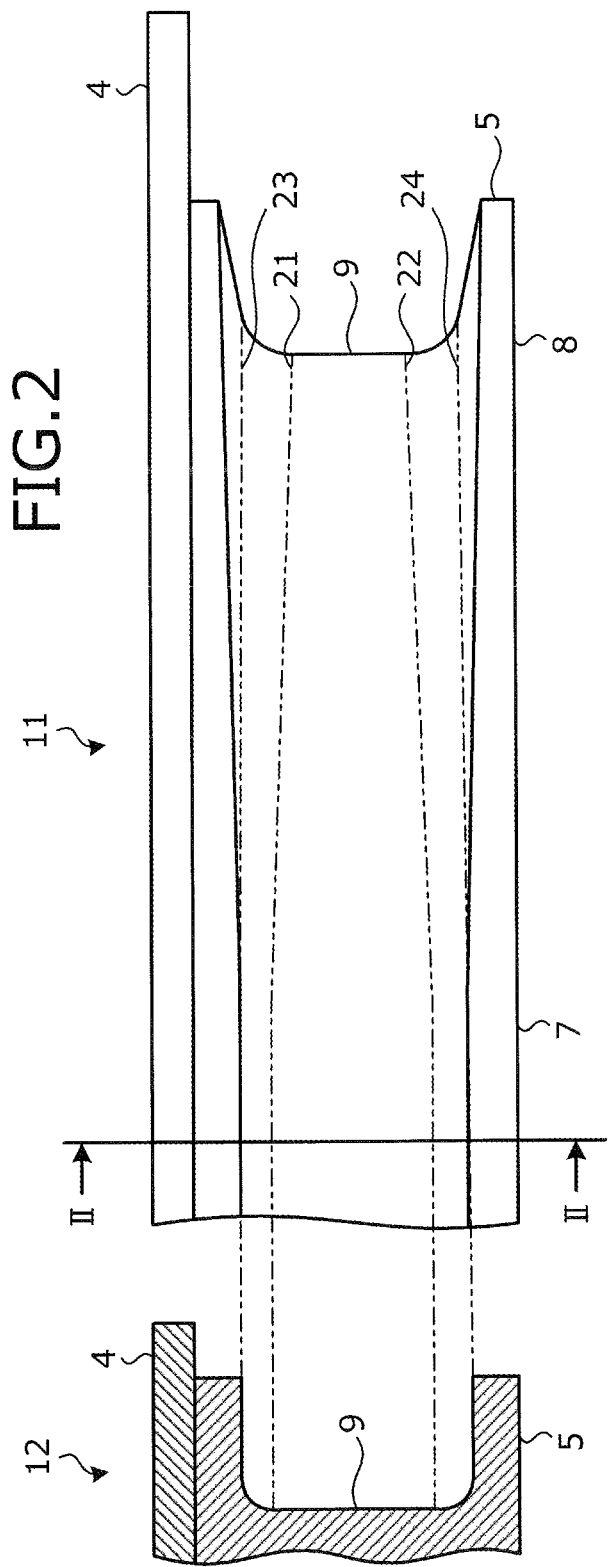

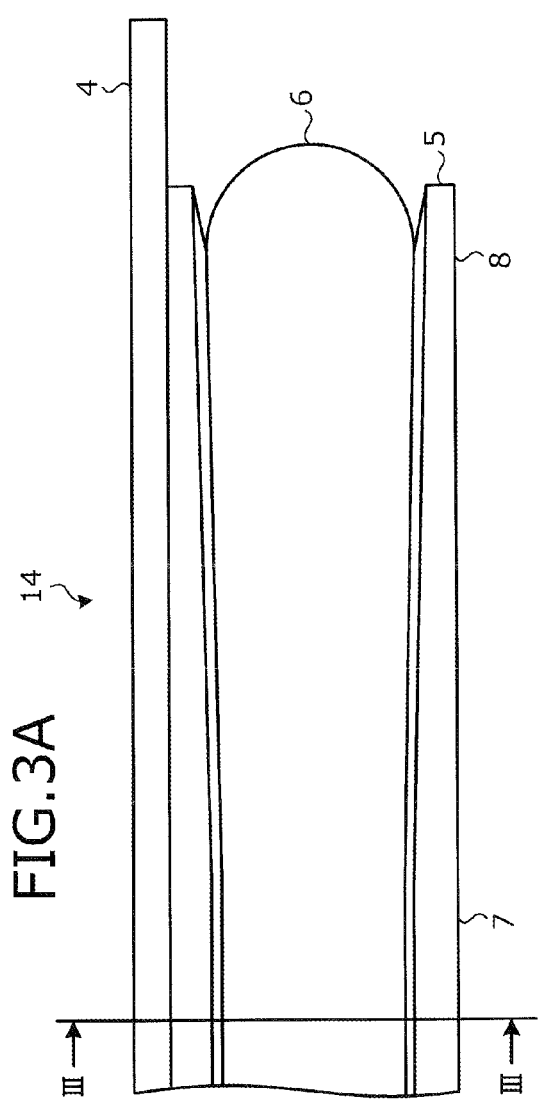
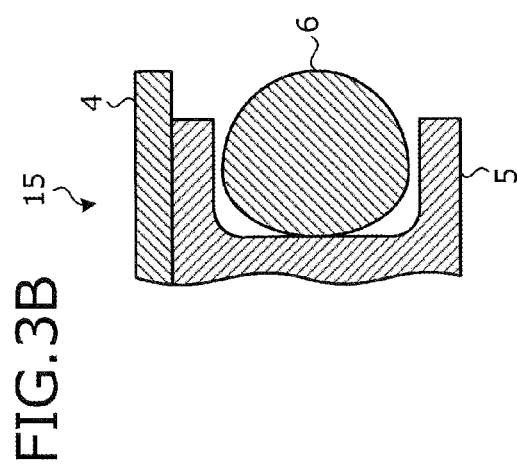

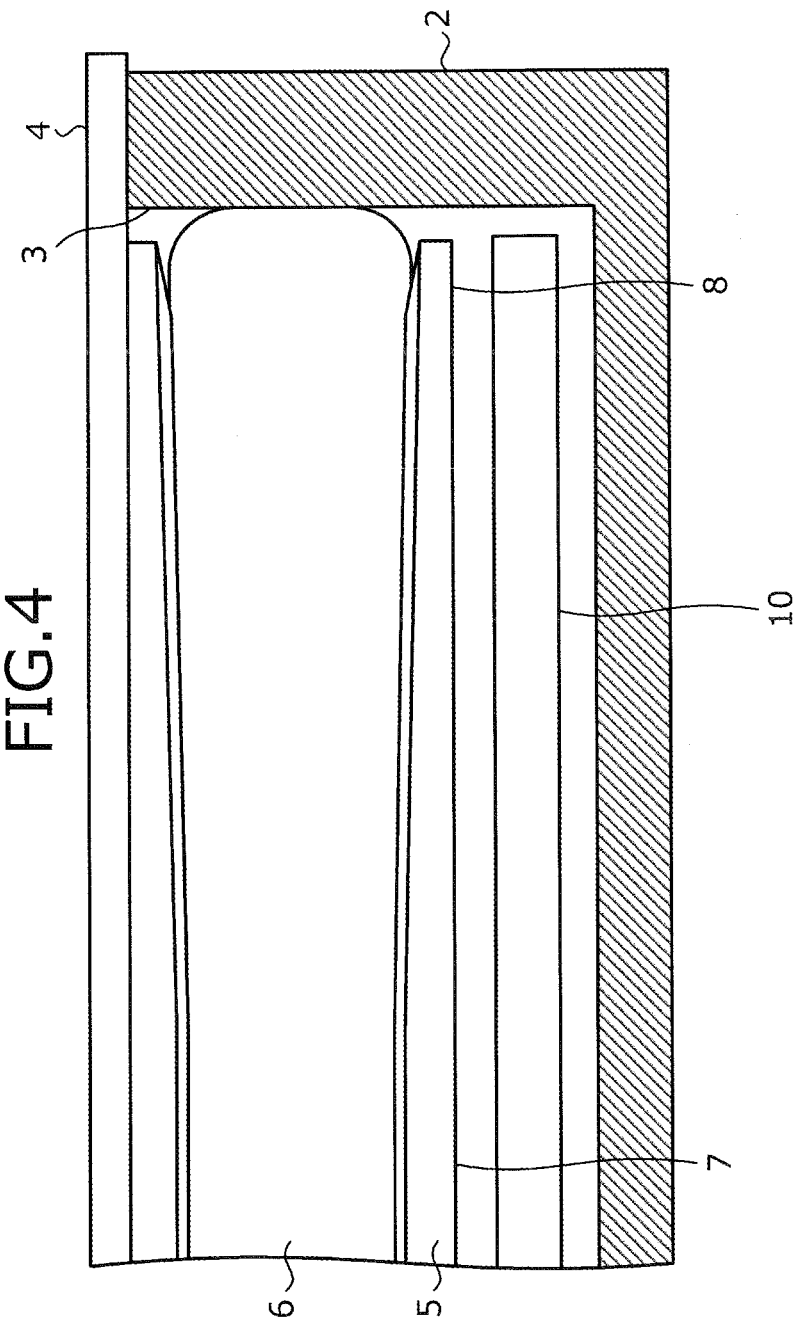

PORTABLE ELECTRONIC APPARATUS

CROSS REFERENCE TO RELATED APPLICATIONS

This application is a continuation application of International Application PCT/JP2011/067904, filed on Aug. 4, 2011 and designating the U.S., the entire contents of which are incorporated herein by reference.

FIELD

The embodiments discussed herein are related to a portable electronic apparatus.

BACKGROUND

Among conventional water-resistant structures of electronic apparatuses, etc., a structure is known in which a cross-sectional area of a rectangular frame-shaped groove holding an O-ring press fitted therein is made smaller on the corners than the cross-sectional area of the rectangular frame-shaped groove on other parts, i.e., sides, in adjustment to the deformation of the O-ring that results when the O-ring is press fitted (see, e.g., Japanese Laid-Open Patent Publication No. 2001-91996). Another water-resistant structure is also known in which the width of a groove holding a liquid packing material injected therein is made larger on corners than the width of the groove on the sides to increase the packing material holding capacity (see, e.g., Japanese Laid-Open Patent Publication No. H7-39043).

However, according to the conventional water-resistant structure using the O-ring, the O-ring becomes hard at the corners where the cross-sectional area of the groove is smaller than the cross-sectional area on the sides and therefore, the O-ring loses elasticity. This leads to a problem that water-resistance becomes inferior at the corners of the O-ring.

SUMMARY

According to an aspect of an embodiment, a portable electronic apparatus has a water-resistant structure in which a cover covers a surface of an opening formed in a casing of the portable electronic apparatus. The portable electronic apparatus includes a mounting unit that has an outer peripheral surface to which frame-shaped packing that encompasses the opening is attached, and is formed on any one among the casing and the cover; and a groove that is formed on an outer peripheral surface of the mounting unit, and holds the frame-shaped packing therein enabling a surface of the frame-shaped packing to be brought into pressure contact with any one among the casing and the cover to which the mounting is not formed. The mounting unit has a side and a corner, and is of a shape that encompasses the opening, and the groove has a shape at the corner different from that along the side.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is an exploded perspective view of a portable electronic apparatus according to an embodiment;

FIG. 2 depicts a side view and a sectional view of a mounting unit and a groove of the portable electronic apparatus of the embodiment;

FIG. 3A is a side view including a corner of the mounting unit;

FIG. 3B is a sectional view of a side of the mounting unit;

FIG. 4 is a side sectional view of a water-resistant structure of the portable electronic apparatus of the embodiment;

DESCRIPTION OF EMBODIMENTS

Figure 5:
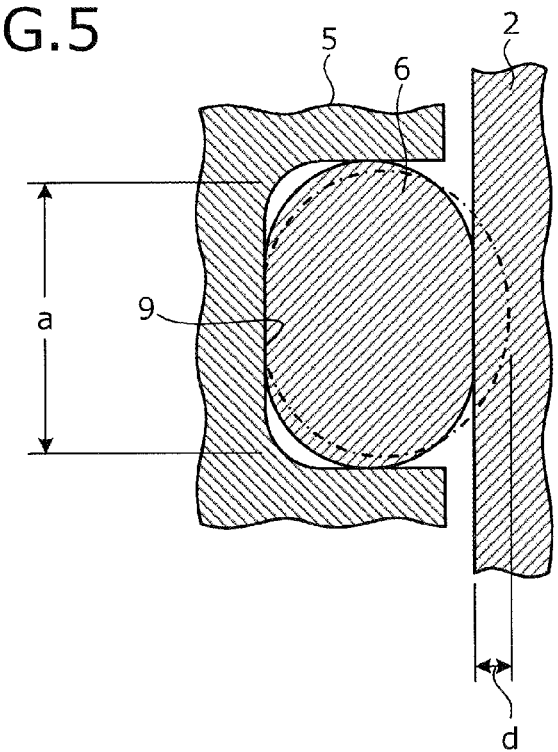
FIG. 5 is a sectional view of the water-resistant structure along the side of the mounting unit of the portable electronic apparatus of the embodiment.

Embodiments of a portable electronic device according to an embodiment will be described in detail with reference to the accompanying drawings. Nonetheless, the invention is not limited by the present embodiments.

FIG. 1 is an exploded perspective view of a portable electronic apparatus according to an embodiment. As depicted in FIG. 1, a portable electronic apparatus 1 has a water-resistant structure in which a cover 4 covers the surface of an opening 3 formed in a casing 2. A mounting unit 5 is formed on any one among the casing 2 and the cover 4. In the following description, the mounting unit 5 is assumed to be formed on the cover 4.

To the outer peripheral surface of the mounting unit 5, frame-shaped packing (O-ring) 6 is attached and encompasses the opening 3. The mounting unit 5 has sides 7 and corners 8. The mounting unit 5 has a shape encompassing the opening 3.

FIG. 2 depicts a side view and a sectional view of the mounting unit and a groove of the portable electronic apparatus of the embodiment. In FIG. 2, reference numeral 11 indicates a side view including the corner 8 of the mounting unit 5, and reference numeral 12 indicates a sectional view of the side 7 of the mounting unit 5, showing a section along a cutting line II-II. As depicted in FIG. 2, the groove 9 is formed on the outer peripheral surface of the mounting unit 5. The shape of the groove 9 on the corner 8 is different from the shape of the groove 9 on the side 7.

FIGS. 3A and 3B are a side view and a sectional view of the mounting unit and the frame-shaped packing of the portable electronic apparatus of the embodiment. FIG. 3A is a side view including the corner 8 of the mounting unit 5 (reference numeral 14); and FIG. 3B is a sectional view of the side 7 of the mounting unit 5 (by reference numeral 15), showing a section along a cutting line III-III in FIG. 3A. As depicted in FIGS. 3A and 3B, the frame-shaped packing 6 is housed in the groove 9 such that the surface of the frame-shape packing 6 can be brought into pressure contact with the casing 2. When the mounting unit 5 is formed on the casing 2, the frame-shaped packing 6 is housed in the groove 9 such that the surface of the frame-shaped packing 6 can be brought into pressure contact with the cover 4.

FIG. 4 is a side sectional view of the water-resistant structure of the portable electronic apparatus of the embodiment. As depicted in FIG. 4, at the corner 8, the surface part of the frame-shaped packing 6 projects from the groove 9 and comes in contact with the inner peripheral surface of the casing 2. This happens also at the side 7, where the surface part of the frame-shaped packing 6 projects from the grove 9 and comes in contact with the inner peripheral surface of the casing 2.

Figure 6:
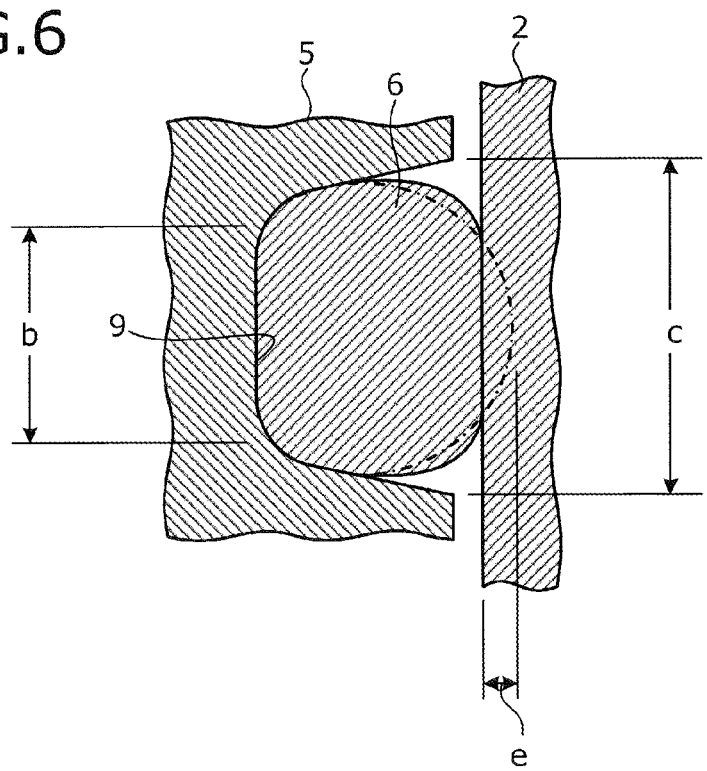
FIG. 6 is a sectional view of the water-resistant structure at the corner of the mounting unit of the portable electronic apparatus of the embodiment.

FIG. 5 is a sectional view of the water-resistant structure along the side of the mounting unit of the portable electronic apparatus of the embodiment. FIG. 6 is a sectional view of the water-resistant structure at the corner of the mounting unit of the portable electronic apparatus of the embodiment. In each of FIGS. 5 and 6, a chain line represents the shape of the frame-shaped packing 6 before coming in contact with the inner peripheral surface of the casing 2.

As depicted in FIG. 5, along the side 7, the frame-shaped packing 6 is in contact with the inner peripheral surface of the casing 2 in a state of contact where the frame-shaped packing 6 is compressed by a sufficient compressing amount d. The width of the bottom of the groove 9 along the side 7 is assumed to be "a". The value of "a" may be that when the frame-shaped packing 6 is in contact with the inner peripheral surface of the opening 3 of the casing 2 in a state where the frame-shaped packing 6 is compressed by the sufficient compressing amount d, the compressed frame-shaped packing 6 just blocks the groove 9, as depicted in FIG. 5.

As depicted in FIG. 6, at the corner 8, the width of the bottom of the groove 9 is denoted by "b" and the distance between the opening ends of the groove 9 is denoted by "c". Although not particularly limited, "a", "b", and "c" may have a relation defined as, for example, [b<a<c]. The groove 9 may have the same depth along the side 7 and at the corner 8, or may be shallower at the corner 8. As depicted in FIG. 6, the frame-shaped packing 6 is in contact with the inner peripheral surface of the opening 3 of the casing 2 in a state of contact where the frame-shaped packing 6 is compressed by a sufficient compressing amount e.

According to the first embodiment, the shape of the groove 9 at the corner 8 is different from the shape of the groove 9 along the side 7. As a result, at the corner 8 of the groove 9, the frame-shaped packing 6 is in contact with the inner peripheral surface of the opening 3 of the casing 2 without becoming hard. This improves the water-resistant performance of the frame-shaped packing 6 on the corner.

A second embodiment relates to an example in which the water-resistant structure described in the first embodiment is applied to, for example, a cellular phone. The water-resistant structure described in the first embodiment can be applied not only to cellular phones but also to various types of portable electronic apparatuses, such as portable game machines and portable electronic dictionaries. As depicted in FIGS. 1 to 4, for example, a battery 10 may be housed in the opening 3 of the casing 2.

As depicted in FIG. 2, the width of the bottom of the groove 9, which is "a" along the side 7 and "b" at the corner 8 (b<a), may narrow stepwise from the side 7 toward the corner 8. "stepwise" may include the meaning of "gradually". In FIG. 2, a demarcated portion between a two-dot chain line 21 and a two-dot chain line 22 substantially represents the bottom of the groove 9. Strictly speaking, the bottom face of the groove 9 may be connected to wall surfaces rising from the bottom surface, via a smooth curved surface, in which case no definite boundary is present between the bottom face of the groove 9 and the wall surfaces. The two-dot chain lines 21 and 22 are drawn for convenience to clearly indicate that the width of the bottom of the groove 9 gradually narrows.

The width "b" of the bottom of the groove 9 at the corner 8 may be determined to be identical to the gauge (diameter) of the frame-shaped packing 6 along the side 7. This prevents the frame-shaped packing 6 from becoming elongated at the corner 8 to an extent that exceeds the extent to which the frame-shaped packing 6 is elongated along the side 7, and becoming flat.

As depicted in FIG. 2 by reference numeral 2 and in FIG. 5, along the side 7, the wall surfaces of the groove 9 may be perpendicular to the bottom face of the groove 9. In other words, configuration may be such that the wall surfaces of the groove 9 are not sloped along the side 7. As depicted in FIG. 2 by reference numeral 11 and in FIG. 6, at the corner 8, the wall surfaces of the groove 9 have sloped surfaces widening from the bottom face toward the opening ends. In FIG. 2, a portion indicated from a two-dot chain line 23 toward the opening end and a portion indicated from a two-dot chain line 24 toward the opening end represent the sloped surfaces. As described above, the distance "c" between the opening ends of the groove 9, the width "a" of the bottom of the groove 9 along the side 7, and the width "b" of the bottom of the groove 9 at the corner 8 may have a relation defined as, for example, [b<a<c].

The cross-sectional area of a region of the groove 9 in which the frame-shaped packing 6 is housed may be substantially the same along the side 7 and at the corner 8. In this case, the frame-shaped packing 6 fills up the groove 9 at substantially the same rate along the side 7 and at the corner 8. Hence, water-resistant performance equivalent to the water-resistant performance along the side 7 can be achieved at the corner 8.

Figure 7:
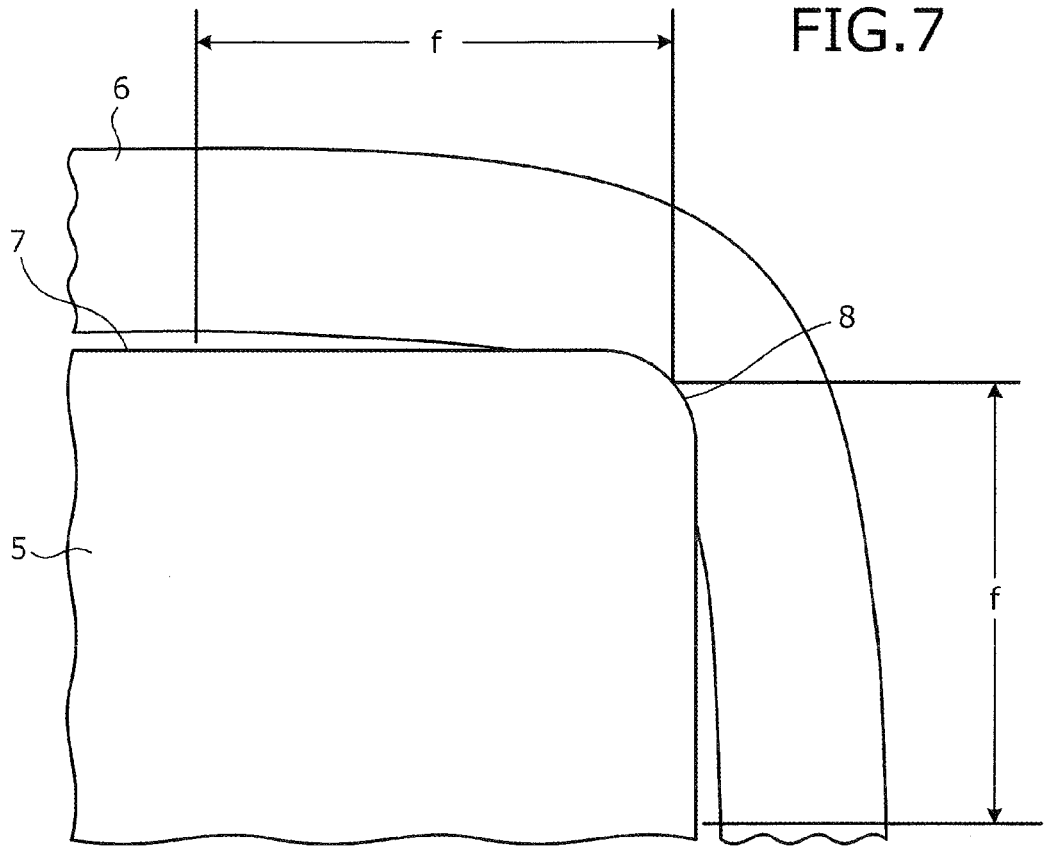
FIG. 7 is an explanatory diagram of an example of dimensions of the groove of the portable electronic apparatus of the embodiment.

FIG. 7 is an explanatory diagram of an example of the dimensions of the groove of the portable electronic apparatus of the embodiment. FIG. 7 is an enlarged view of a vicinity of the corner 8 in a state in which the frame-shaped packing 6 is attached to the mounting unit 5. FIG. 7 is drawn on the assumption that the mounting unit 5 does not have the groove 9. As depicted in FIG. 7, the frame-shaped packing 6 elongates at the corner 8 to a greater extent than along the side 7. As a result, the cross-sectional area of the frame-shaped packing 6 changes from the side 7 toward the corner 8. Research conducted by the inventors has revealed that the cross-sectional area of the frame-shaped packing 6 changes on the order of about 3 mm from the center of the corner 8. The extent to which the cross-sectional area of the frame-shaped packing 6 changes depends on the gauge of the frame-shaped packing 6.

For example, if the gauge of the frame-shaped packing 6 before attachment to the mounting unit 5 is $\phi 0.7$ mm to $\phi 1.5$ mm, the distance f from the center of the corner 8 to a range in which the shape of the groove 9 changes from the side 7 toward the corner 8 is preferably 2 mm or more to 5 mm or less. In other words, the shape of the groove 9 may change stepwise from a point 5 mm from the center of the corner 8 toward the center of the corner 8. It is preferable that the shape of the groove 9 changes stepwise at least from a point 2 mm distant from the center of the corner 8 toward the center of the corner 8. The shape of the groove 9 may change stepwise from a point 3 mm from the center of the corner 8 toward the center of the corner 8.

Figure 8:
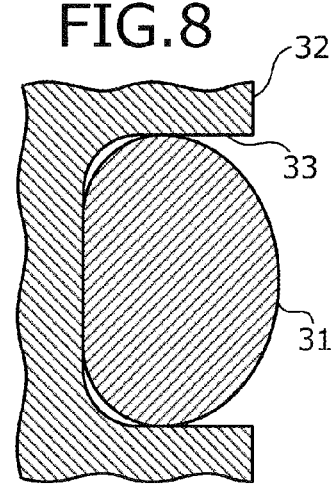
FIG. 8 is a sectional view of frame-shaped packing in a groove at a corner in a case where the shape of groove at the corner is the same as that along the side.
Figure 9:
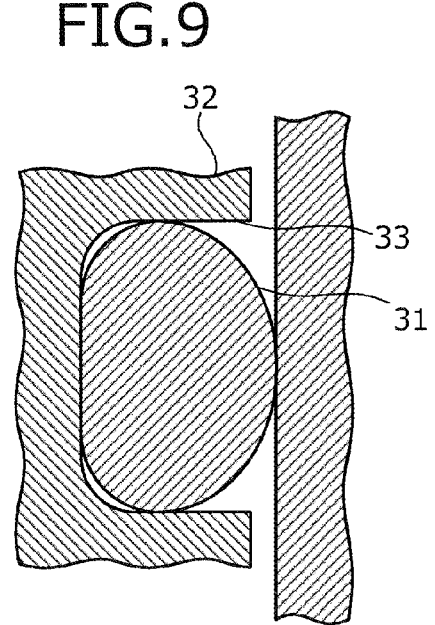
FIG. 9 is a sectional view of a water-resistant structure at the corner of a groove in a case where the shape of the corner is the same as the shape of the side.

FIG. 8 is a sectional view of frame-shaped packing in a groove at a corner in a case where the shape of groove at the corner is the same as that along the side. FIG. 9 is a sectional view of a water-resistant structure at the corner of a groove in a case where the shape of the corner is the same as the shape of the side. When the shape of a groove 33 at a corner is made identical to that along the side, frame-shaped packing 31 elongates at the corner, to a greater extent than along the side and becomes flat in the groove 33 of a mounting unit 32, as depicted in FIG. 8. As a result, at the corner, the surface of the frame-shaped packing 31 does not come in contact with the inner peripheral surface of the opening of the casing and even if contact is made, the frame-shaped packing 31 fails to be in a state of contact where the frame-shaped packing 31 is compressed by a sufficient compressing amount. Thus, sufficient water-resistant performance cannot be achieved at the corner.

The inventors have examined this problem and reached a conclusion that even when the shape of the groove at the corner is made to be identical to that along the side, if the curvature (radius) of the corner is, for example, about two times the gauge of the frame-shaped packing, the flattening of the frame-shaped packing at the corner can be suppressed, thereby achieving water-resistant performance at the corner. The curvature (radius) of the corner, therefore, may be determined to be about two times the gauge of the frame-shaped packing. In this case, the curvature (radius) of each of the four corners of the opening 3 of the casing 2 is determined to be about two times the gauge of the frame-shaped packing. As a result, for example, the opening 3 of the casing 2 becomes larger as a whole relative to the battery 10. Consequently, the mounting unit 5 of the cover 4 becomes larger, too.

The inventors have further examined this problem and reached a conclusion that if the shape of the groove 9 is changed stepwise from the side 7 toward the corner 8, as described in the second embodiment, sufficient water-resistant performance is achieved at the corner even when the curvature (radius) of the corner is determined to be, for example, 0.5 mm. The curvature (radius) of the corner, therefore, may be determined to be about 0.5 mm. In this case, the curvature (radius) of each of the four corners of the opening 3 of the casing 2 is determined to be about 0.5 mm. As a result, the opening 3 of the casing 2 and the mounting unit 5 of the cover 4 become equal in size, for example, to the battery 10. Thus, the portable electronic apparatus 1 can be reduced in size.

The second embodiment offers the same effects that the first embodiment offers. According to the second embodiment, the frame-shaped packing 6 does not become hard at the corner 8 of the groove 9. This prevents application of an excessive reaction force to the casing 2 against which the frame-shaped packing 6 is pressed. As a result, the casing 2 does not need to be fabricated as a solid casing by increasing the wall thickness of the casing 2. Thus, the portable electronic apparatus 1 can be reduced in size and weight.

According to this portable electronic apparatus, the water-resistant performance of a frame-shaped packing on corners can be improved.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A portable electronic apparatus having a water-resistant structure in which a cover covers a surface of an opening formed in a casing of the portable electronic apparatus, the portable electronic apparatus comprising:
   a mounting unit that has an outer peripheral surface to which frame-shaped packing that encompasses the opening is attached, and is formed on any one among the casing and the cover; and
   a groove that is formed on an outer peripheral surface of the mounting unit, and holds the frame-shaped packing therein enabling a surface of the frame-shaped packing to be brought into pressure contact with any one among the casing and the cover to which the mounting is not formed, wherein
   the mounting unit has a side and a corner, and is of a shape that encompasses the opening, and
the groove has a width at the corner different from that along the side.

2. The portable electronic apparatus according to claim 1, wherein
   the groove has a sloped surface at the corner.

3. The portable electronic apparatus according to claim 1, wherein
   the groove has a holding region at the corner and a holding region along the side that have substantially equivalent cross-sectional areas.

4. The portable electronic apparatus according to claim 2, wherein
   the groove has a holding region at the corner and a holding region along the side that have substantially equivalent cross-sectional areas.

5. The portable electronic apparatus according to claim 1, wherein
   the groove has a shape that changes stepwise from an end of the side toward the corner.

* * * * *